US008923016B2

(12) United States Patent
Weiss et al.

(10) Patent No.: US 8,923,016 B2
(45) Date of Patent: Dec. 30, 2014

(54) SOLAR MODULE FOR GENERATING A D.C. VOLTAGE AND METHOD FOR ITS OPERATION

(76) Inventors: Rainer Weiss, Erlangen (DE); Peter Beckedahl, Oberasbach (DE); Ingo Staudt, Nürnberg (DE)

( * ) Notice: Subject to any disclaimer, the term of this patent is extended or adjusted under 35 U.S.C. 154(b) by 183 days.

(21) Appl. No.: 13/491,242

(22) Filed: Jun. 7, 2012

(65) Prior Publication Data
US 2012/0314464 A1 Dec. 13, 2012

(30) Foreign Application Priority Data
Jun. 7, 2011 (DE) .......................... 10 2011 077 160

(51) Int. Cl.
*H02M 3/335* (2006.01)
*H02M 7/537* (2006.01)

(52) U.S. Cl.
USPC ................... 363/17; 363/24; 363/26; 363/95; 363/98; 363/131; 363/132

(58) Field of Classification Search
USPC ................... 363/17, 24, 26, 95, 98, 131, 132
See application file for complete search history.

(56) References Cited

U.S. PATENT DOCUMENTS

| 8,094,475 B2 | 1/2012 | Friebe et al. | |
|---|---|---|---|
| 8,582,331 B2* | 11/2013 | Frisch et al. | 363/56.02 |
| 8,638,581 B2* | 1/2014 | Zacharias et al. | 363/132 |
| 2005/0286281 A1* | 12/2005 | Victor et al. | 363/131 |
| 2008/0094867 A1* | 4/2008 | Muller et al. | 363/56.05 |
| 2009/0207639 A1* | 8/2009 | Tanaka et al. | 363/141 |
| 2009/0316457 A1* | 12/2009 | Friebe et al. | 363/131 |
| 2011/0194216 A1 | 8/2011 | Schaub et al. | |

FOREIGN PATENT DOCUMENTS

| DE | 10 2006 034 351 | 2/2008 |
|---|---|---|
| DE | 10 2008 050 543 | 4/2010 |
| EP | 2136465 | 12/2009 |

\* cited by examiner

*Primary Examiner* — Bao Q Vu
(74) *Attorney, Agent, or Firm* — The Law Offices of Roger S. Thompson

(57) ABSTRACT

A solar module has a solar cell which generates a DC voltage. The module has a converter for converting a DC voltage fed into its input. The module contains a semiconductor switch and a controller which drives a switching input of the semiconductor switch. The controller drives the semiconductor switch variably so that the semiconductor switch switches more slowly during the transition operation than during normal operation, thereby reducing a dynamic overvoltage on the switch such that the voltage present on the switch does not exceed the blocking voltage of the switch.

15 Claims, 2 Drawing Sheets

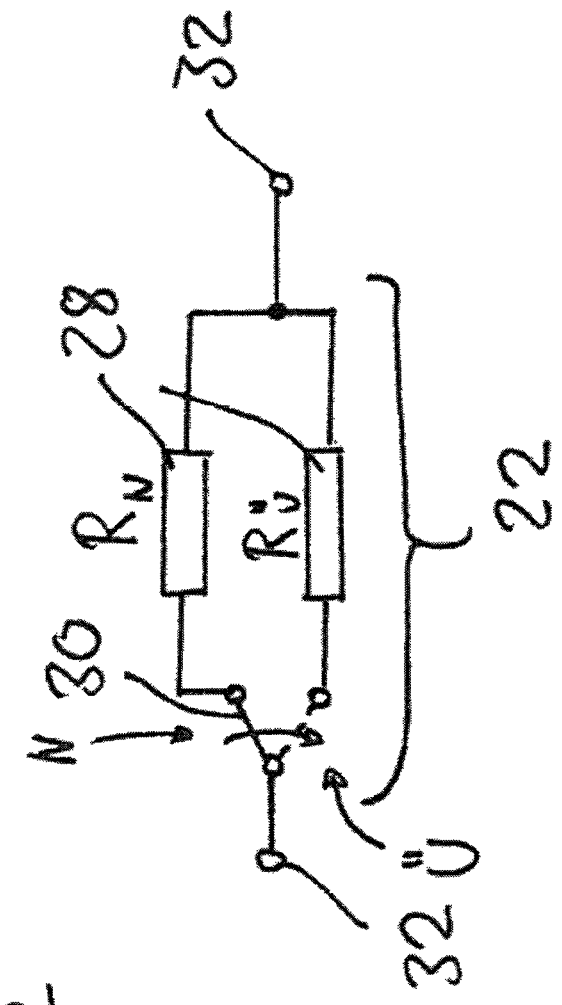

SOLAR MODULE FOR GENERATING A D.C. VOLTAGE AND METHOD FOR ITS OPERATION

BACKGROUND OF THE INVENTION

1. Field of the Invention

The invention relates to a solar module, comprising a solar cell and a converter, and to a method for its operation.

2. Description of the Related Art

Solar cells are commonly used to generate regenerative energy. To prepare the DC voltage generated by the solar cells for use, for example in a power supply network, they are combined with a converter, generally an inverter, to form a solar module. The converter converts the DC voltage received by the converter from the solar cells into an AC voltage which is in turn supplied to the power supply network. The solar cell generally mentioned in the singular here in practice often comprises a plurality of individual solar cells connected in series. In a known, simple embodiment, the converter has at least two transistor half bridges. Each half bridge contains then at least two transistors with at least two freewheeling diodes. Further semiconductors can be located between the solar cell and the converter. As a rule, therefore, the DC voltage generated by the solar cell is fed into the AC network by means of an inverter. To this end, a pulse pattern is generated with which the transistors of the inverter are switched.

Non-illuminated or weakly illuminated solar cells supply no DC voltage or too low a DC voltage to have this processed further by the converter. The converter is therefore initially inoperative. When the solar cell begins to be illuminated, its no-load voltage rises quickly to a value that is higher than in normal operation. The no-load voltage is present when no or only a very low load current flows through the solar cell. As compared with an output voltage when the solar cell is loaded with a load current, this value is very high, frequently about twice as high. This is present on the internal resistance of the solar cell.

In particular at cold ambient temperatures, which means in winter and at sunrise, the solar cell has a maximum-no-load voltage. Consequently, the DC voltage present on the inverter in the form of its intermediate circuit voltage also reaches a maximum, since the inverter is not yet in operation and therefore no noticeable current flows through the solar cell. During operation of the inverter, i.e., when a load voltage is drawn from the solar cell, the DC voltage drops substantially, for example from a peak voltage of 900 V to a regular (operating) voltage of 500 V. The voltage output by the solar cell therefore depends, inter alia, on the solar irradiation, the temperature and the current flow through the cell.

Thus, it is always possible to think of a starting or transition operation in which the output voltage from the solar cell is above the permitted input voltage of the converter.

It is known to use an inverter for the solar cell which is designed only for the operating voltage of the solar cell, i.e., for 500 V in the example. In the starting case outlined above, however, the permissible operating voltage of the inverter is exceeded considerably by the no-load voltage of the solar cell of 900 V. Direct starting is therefore not permissible under these circumstances because of the maximum operating voltage of the solar cell being exceeded by the no-load voltage of the solar cell.

It is known, during start-up operation of the solar cell, to assign to the input of the inverter a device for the temporary reduction of the intermediate circuit voltage, a chopper, for example with a load resistance. Before the inverter is connected, the solar cell is loaded by the chopper. A load current flows in the solar cell. The current flowing through the chopper in this case loads the solar cell, so that its voltage value and thus the intermediate circuit voltage to be fed to the converter, falls to a value which is in the permitted voltage range of the inverter. The input voltage, which means the intermediate circuit voltage, at the inverter is therefore reduced to the maximum permissible intermediate circuit voltage. The inverter can then be started up, the chopper becomes inactive, the inverter can start up and feed power into the network. During start-up operation of the solar cell, a chopper is therefore needed in such a configuration.

Alternatively, it is known to use fewer solar cells in a solar module in order to lower its maximum voltage, or to dimension the converter for the maximum available no-load voltage of the solar cell. The voltage on the converter is determined by the number of solar cells connected in series. In this case, the highest possible voltage is aimed for, since the most power can then be transferred with an inverter. The maximum no-load voltage, which means the maximum voltage fed to the converter, is always below the permissible converter voltage or intermediate circuit voltage even in start-up or transition operation. However, since the transition operation lasts only a few seconds as compared with many hours of normal operation, during normal operation the converter then operates considerably below its design limits for nearly all of its operation. The semiconductors in the converter will be loaded fully in terms of voltage only for a few seconds; in the rest of the time the converter is over-dimensioned. As soon as the converter works towards the network, the voltage decreases considerably, as described above.

This over-dimensioning of the circuitry adds considerably to its manufacturing cost.

SUMMARY OF THE INVENTION

The object of the invention is to provide an improved solar module which may more efficiently operate under all circumstances, and which is more economical to manufacture than heretofore known.

The inventive solar module contains a solar cell which generates a DC voltage. The solar cell is connected to a converter or feeds the input of the latter with the generated DC voltage. The converter converts the DC voltage, for example to a network AC voltage of a supply network. The converter contains at least one semiconductor switch and a controller which drives a switching input of the semiconductor switch. According to the invention, the controller is constructed so that: during a transition operation of the solar module, the semiconductor switch is driven differently than when it is under normal operation, such that the switch switches more slowly than it does during normal operation. The slower switching behavior reduces a dynamic overvoltage on the semiconductor switch. The reduction in the overvoltage means that the voltage present on the semiconductor switch does not exceed the blocking voltage of the semiconductor switch.

The invention is suitable for all types of single-phase and multi-phase converters with all types of semiconductor switches, preferably transistors. A preferred converter has a plurality of semiconductor switches, for example four, which are wired in an H-bridge circuit. Other known topologies are multi-level converters, for example three-level inverters.

The invention is based on the following findings and considerations:

In an inverter with a half bridge, a current from the upper transistor, the upper semiconductor switch of a half bridge, commutates to the respective lower freewheeling diode of the semiconductor switch there and back or from the lower transistor of the half bridge to the upper freewheeling diode. Because of parasitic inductances of the half bridge and/or the connections to the intermediate circuit capacitor, a dynamic overvoltage is produced on the semiconductors, the magnitude of which depends on the rate of rise of the current during the commutation. The dynamic overvoltage is generated by parasitic inductances. The dynamic overvoltage is superimposed on the voltage across the capacitor, which is substantially predefined by the solar cell. During switching, the semiconductor voltage is therefore the sum of capacitor voltage and dynamic overvoltage. This voltage on the semiconductor must never exceed its specified voltage, since otherwise the latter will be damaged or destroyed.

The current rate of rise during the commutation is determined by the structure of the inverter and its components, in particular by the parasitic inductances, specifically the structural and connecting components of the intermediate circuit, and by the switching characteristics of the transistors. Changing the configuration of the switching input of the transistor, e.g., the base configuration, changes its switching behavior. For this purpose, the switching input is generally driven by a voltage source which is connected via a resistor to the control input, for example therefore a base resistor or a gate resistor. It is possible to exert an influence on the switching behavior by varying the resistance value or else the voltage value of the voltage source. An increased resistance or a smaller control voltage in this case reduces the current rate of rise during the commutation of the semiconductor switch and thus generates fewer dynamic overvoltages on the latter during switching. On the other hand, high switching losses then arise in the semiconductor switch, which is above all disadvantageous at a high load current. However, at no load currents, this is almost insignificant.

By contrast, a reduced resistance and/or a control voltage of which the magnitude is increased increases the current rate of rise during the commutation and thus generates a high dynamic overvoltage on the semiconductor switch. On the other hand, however, the switching losses are then low. The respective semiconductor switch is switched off by using a negative voltage. Here, by way of example, only switching on is considered but the method functions in an analogous way when switching off.

First of all, it is conceivable to start the converter at an input voltage which exceeds its permissible continuous input voltage or intermediate circuit voltage during normal operation: Here, the inverter is initially started up with a very low output current in order to load the solar cell at least slightly by means of a current flow. As a result, the voltage from the solar cell already decreases considerably—starting from the no-load voltage. As a result of the gradually reducing intermediate circuit voltage with respectively increased load current, the output current from the inverter can be increased up to the rated value. During this transition operation with increased intermediate circuit voltage, the dynamic overvoltage must be lower than in normal operation, in order that the total voltage from the intermediate circuit voltage, that is to say the voltage from the solar cell plus the dynamic overvoltage, is always lower than the blocking voltage of the semiconductor switch. The blocking voltage here is the maximum voltage of the power, therefore semiconductor, switch.

The voltage U on the semiconductor switch originates from the voltage from the solar cell or intermediate circuit voltage of the same value and the dynamic overvoltage generated by dynamic effects. Critical for the dynamic overvoltage are the currents I flowing through parasitic inductances L or their change over time, which leads to an induced voltage, the dynamic overvoltage $U_{\ddot{U}}$. The voltages U are given by U=LdI/dt, i.e., they are directly proportional to a change in the current I over time. As a result of the operation of the inventive controller, the power semiconductor switches more slowly, and there is therefore a concomitant slower change in current. This causes the dynamic overvoltages in the converter to decrease considerably. Although, during this transition operation, the converter does not operate optimally with respect to its dynamic losses, according to the invention, this transition operation, carried out for only a short time in relation to normal operation, is intentionally tolerated. The design limits of the converter can then nevertheless be aligned with the solar voltages in normal operation. According to the invention, therefore, the special characteristics of a combination of solar cell and converter are used, since the extremely elevated no-load voltage of the solar cell drops particularly quickly even with only low load currents of the solar cell, and thus the transition operation is only of a particularly short duration.

Semiconductor switches react particularly critically to elevated voltage. Exceeding the blocking voltage even once can destroy the power semiconductor. Use of the invention avoids overvoltages. On the other hand, high thermal losses in the converter during the transition operation are accepted in this case. The thermal loading of the converter initially increases slowly, however, with the effect of time averaging. Since, as a rule, the time period of transition operation is shorter than would be possible for the thermal rise to become damaging, the thermal behavior of the converter can be buffered here. The time period of the transition operation, in which the (actually too high) power loss arises is therefore generally not sufficient to overload the converter thermally. During normal operation, which means with regular switching behavior optimized to thermal loading, the instantaneous thermal loading in the converter falls to the permitted level again.

Parasitic inductances are always present and always lead to a dynamic overvoltage. During normal operation, this dynamic overvoltage—on account of the optimization of the switching behavior of the converter to low forward losses—has a certain maximum value which, together with the solar voltage, must lie below the blocking voltage. The converter is designed for this. According to the invention, the dynamic overvoltage in transition operation is held substantially lower than in normal operation, in order to compensate for the higher voltage supplied by the solar cell. The following variables apply: $U_{pv}$ is the voltage of the solar cell and equal to the intermediate circuit voltage. $U_{\ddot{U}}$ is the dynamic overvoltage during transition operation. $U_{Sp}$ is the maximum permitted blocking voltage on the semiconductor switch. The invention therefore manifests itself in the transition operation: in this case, the dynamic overvoltage is lower than in normal operation and must therefore satisfy the following condition:

$$U_{pv}+U_{\ddot{U}}<U_{Sp}$$

In other words, in a solar converter or inverter, the input configuration of the semiconductor switch, for example the base configuration of the latter, is adapted to the operating point of the solar cell. With high solar irradiation, a great deal of electrical power is generated and the load current rises, at the same time the solar cell voltage decreases because of the internal resistance. The switching losses of the semiconductors are minimized with a fast switching behavior, and the inverter operates more efficiently. In order to start up the solar cell, on the other hand, by means of a slow switching behavior the dynamic overvoltages in the converter are lowered to such an extent that these, together with the increased output voltage from the solar cell, still lie below the voltage limits permitted in the converter. The adaptation of the switching behavior in accordance with the invention can therefore be applied both only to switching on and only to switching off or to switching on and off the semiconductor switch.

In a preferred embodiment of the invention, the converter has on its input a maximum permissible continuous voltage for normal operation which is lower than a maximum DC voltage generated by the solar cell during transition operation. In other words, thanks to the invention, it is possible to design the converter only for the operating voltage generated by the solar cell during normal operation as the maximum permissible continuous voltage and to tolerate the elevated no-load voltage or start-up voltage of the solar cell during transition operation.

In a further preferred embodiment, start-up operation of the solar cell is chosen as the transition operation for the dimensioning of the converter. In the least beneficial case, in this start-up operation the output voltage is increased considerably as compared with normal operation. Thus, even for extremely unfavorable operating conditions of the solar cell, the solar module can be designed optimally with respect to the increase in its no-load voltage as compared with the normal voltage.

In a preferred embodiment of the invention, the controller includes a voltage source for driving the semiconductor switch. According to the invention, the value of the voltage supplied to the switching input by the voltage source can then be varied. In other words, the input or control voltage of the semiconductor switch, that is to say, for example, the base voltage of the transistor, is matched to the voltage across the capacitor or the output voltage of the solar cell, specifically in such a way that when there is a high capacitor voltage, the control voltage is low and as the capacitor voltage falls, the control voltage is increased. The adaptation of the voltage can be achieved, for example, by varying the effective internal resistance of the voltage source. For this purpose, either a voltage drop is produced in series with the source, for example with a further transistor, or the voltage source is operated in pulsed operation in the manner of a pulse-width-modulated (PWM) circuit, to vary the effective voltage present on the switching input acting on the semiconductor switch. In addition, the voltage of the voltage source itself can simply be lowered.

In a further embodiment, the solar module or, more particularly, the controller, contains an electrical resistor leading to the switching input of the semiconductor switch. The semiconductor switch is therefore driven via this resistor. Its resistance value can then be varied, to achieve the aforementioned switching behavior.

In transition operation of the converter, the resistance value of the resistor can be increased as compared with its resistance value during normal operation of the converter. In other words, in transition operation the resistance value of the resistor is enlarged or increased as compared with its resistance value in normal operation.

Generally, the semiconductor switch is a bipolar transistor or IGBT (insulated gate bipolar transistor), the switching input of which then has a base or a gate. The resistor is then a base or gate resistor. The resistor is a separate component, for example, or is integrated into the controller, for example as a driver. However, the resistor can also be integrated into a semiconductor module together with the semiconductor switch as a series resistor of the latter.

The switching behavior of the power semiconductor in the converter is also determined by its series resistors, via which its control inputs (e.g., the gate of an IGBT) are connected to a controller, for example to a driver. The series resistors, under these circumstances gate resistors, are in this case optimized to minimal losses of the inverter, although this results in high dynamic overvoltages on the power semiconductors within the inverter. These overvoltages do not constitute any danger at the maximum permissible voltage of the inverter, i.e., the nominal intermediate circuit voltage. However, since the inverter is intended to start up with an elevated voltage in the manner described, there is the danger of destroying the semiconductors because of exceeding the blocking voltage. The invention prevents this, as explained above.

The embodiments comprising varying the voltage source and the resistors can in each case be used on their own or in combination.

In a further preferred embodiment, the resistor is a resistor that can be switched between at least two resistance values. The use of only two different resistance values is sufficient for the implementation of the idea of the invention in the solar module. Such switchable resistors can be implemented particularly simply. The resistor then has a first value during normal operation, and a second, a higher, value during transition operation.

In a particularly simple embodiment, the resistor has between its two terminals at least two partial resistances that can be connected as desired between the terminals. In this case, for example, one solution of an actual alternative switching between first and second resistance is conceivable. However, also conceivable is a parallel connection of a first partial resistance with a second partial resistance used on its own during transition operation in order to lower the resistance value during normal operation; alternatively, also a corresponding series connection with a bypass function for one of the partial resistances.

In a further preferred embodiment, the solar module contains a monitor module, which is designed so that it monitors possible overheating in the converter. Since, during transition operation, the danger of thermal overloading of the converter is tolerated, if the transition operation lasts longer than intended, thermal monitoring of the solar module at this point is particularly expedient, in order here for example to achieve an emergency shutdown, that is to say switching the converter to a voltage-free state, in order to give the latter an opportunity to cool down.

In a further preferred embodiment, the solar module contains a monitor module which is designed in such a way that it monitors an operating period of the transition operation. This is also used, as described above, to safeguard against the thermal overloading of the converter during transition operation but here not only by means of temperature monitoring but also by indirect time monitoring of the duration of the transition operation and therefore by estimating the thermal loading in the converter arising in this case. Here, too, an emergency shutdown can be carried out by the monitor module.

With regard to the method, the object is achieved by operating a solar module as described above. As already mentioned, according to the invention, the controller switches the semiconductor switches more slowly during transition operation of the converter than during its normal operation.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings:

FIG. 2 is a schematic view of an alternative electrical resistor used with the inventive solar module.

DETAILED DESCRIPTION OF THE PRESENTLY PREFERRED EMBODIMENTS

Figure 1:
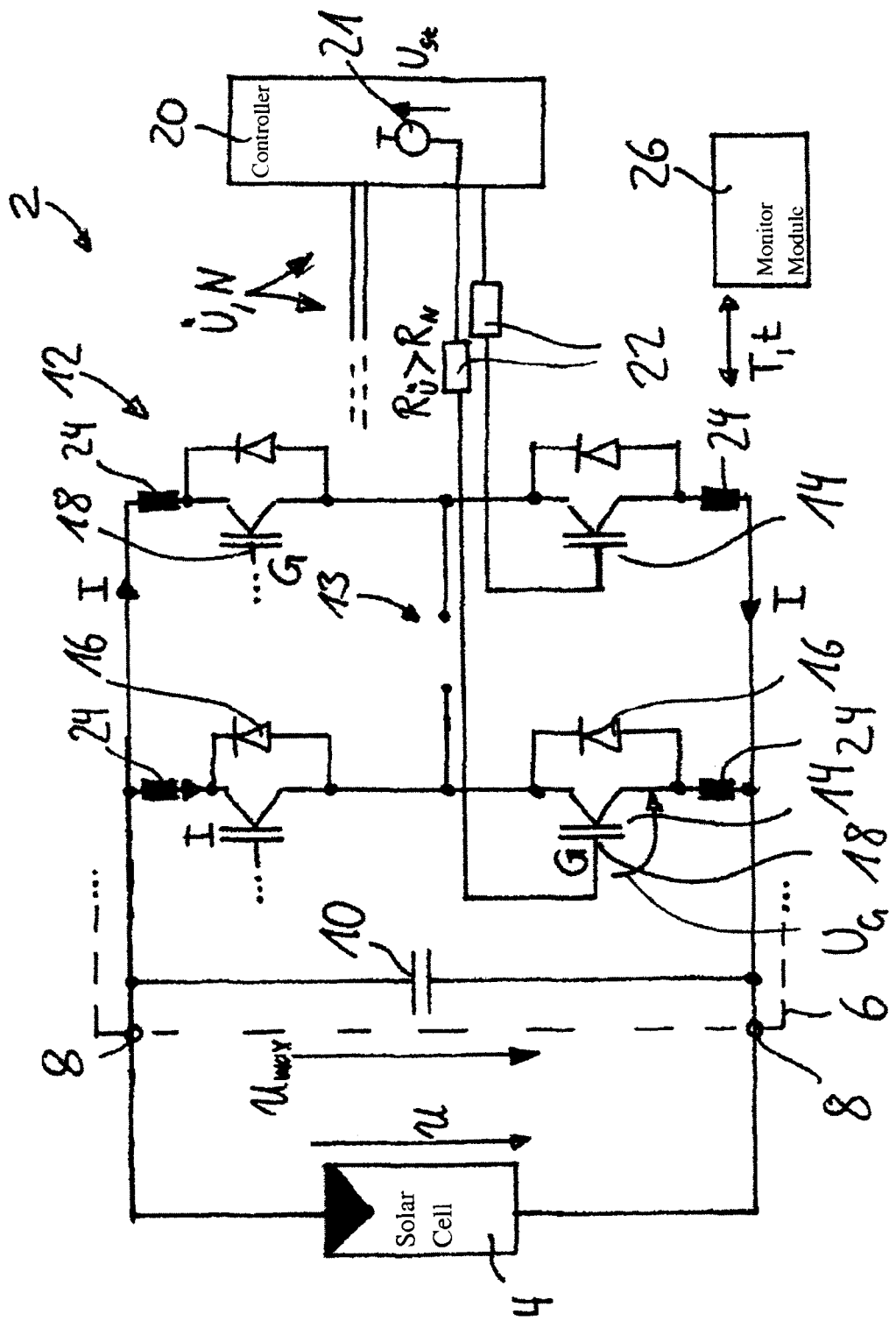
FIG. 1 is a schematic view of a solar module according to the invention.

FIG. 1 shows, generally at 2 a solar module in accordance with the invention. Solar module 2 comprises a solar cell 4 and a converter 6. During operation, solar cell 4 generates a DC voltage U, which it feeds into an input 8 of converter 6. Converter 6 converts the DC voltage U into a voltage not specifically designated, for example a network voltage.

Converter 6 contains an intermediate circuit capacitor 10 and an H-bridge 12 having four semiconductor switches 14, preferably, as illustrated, in the form of IGBTs, with which respective diodes 16 are connected in anti-parallel. Each semiconductor switch 14 has a switching input 18, here in each case the gate G of the IGBTs. Converter 6 has in H-bridge 12 an output to a network 13.

Converter 6 additionally contains a controller 20, which drives respective switching inputs 18 of semiconductor switches 14. Each switching input 18 is connected to controller 20 via a resistor 22. Controller 20 includes a voltage source 21 connected to resistors 22 and having a control voltage $U_{St}$. On switching input 18, the result is then a switching voltage $U_G$ fed to semiconductor switch 14. According to the invention, resistor 22 is implemented so that it has a first resistance value $R_N$ during normal operation. In transition operation of converter 6, however, resistor 22 has a resistance value $R_Ü$ which is greater than resistance value $R_N$. Converter 6 has on its input 8 a maximum voltage $U_{max}$ that is permissible for normal operation. This is the (maximum) voltage at the output from the solar cell in continuous operation.

The transition operation of converter 6 is then always carried out when the DC voltage U is greater than the maximum voltage $U_{max}$. A few parasitic inductances 24 are indicated symbolically in solar module 2. If, with a DC voltage U which is higher than the maximum voltage $U_{max}$, converter 6 is operated with the resistance value $R_N$, as a result of the rapidly changing currents I in the converter 6, caused by the rapid switching of semiconductor switches 14, dynamic voltages are produced on parasitic inductances 24, which could destroy semiconductor switches 14.

Since, according to the invention, however, the higher resistance value $R_Ü$ is used in this transition operation, semiconductor switches 14 exhibit a slower switching behaviour as compared with normal operation. The changes over time in currents I in converter 6 are lower, and therefore the induced voltages on inductances 24 are likewise lower, so that the permissible maximum voltages on semiconductor switches 14 are not exceeded.

In an alternative embodiment, alternatively or additionally to varying the resistance value of the resistor 22, the value of the switching voltage $U_G$ fed to semiconductor switch 14 is varied. To this end, the control voltage $U_{St}$ is then varied, for example by increasing an internal resistance in voltage source 21. During transition operation Ü, the values of both voltages are thus reduced as compared with the values during normal operation N.

Converter 6 preferably additionally contains a monitor module 26 which, at least during the transition operation Ü, either monitors a temperature T or a time t as the duration of transition operation Ü, to prevent thermal overloading of converter 6 or its semiconductor switches 14 and to switch the latter off if necessary.

During transition operation Ü, therefore, although higher switching losses in the semiconductor switches 14 are produced, according to the invention these losses are tolerated because of the shorter time period of the transition operation Ü as compared with the normal operation N.

FIG. 2 shows an embodiment of resistor 22 which can be switched between two resistance values $R_N$ and $R_Ü$. Resistor 22 contains two partial resistances 28, of which one exhibits the resistance value $R_N$ and the other the resistance value $R_Ü$. By means of a switch 30, these can be switched between the two terminals 32 of resistor 22 as desired, depending on normal operation N or transition operation Ü.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A solar module having a solar cell for generating a DC voltage, the solar module comprising:
    an input for receiving a DC voltage; and
    a converter for converting the DC voltage received by said input;
    said converter including at least one semiconductor switch having a switching input and a controller for driving said switching input;
    said controller further including means for variably driving at least one of said at least one semiconductor switches during a transition operation of the solar module and during a normal operation of the solar module;
    said at least one of said at least one semiconductor switches having a predetermined blocking voltage;
    wherein said controller is configured to drive said at least one of said at least one of said semiconductor switches during said transition operation of the solar module so that said at least one of said at least one semiconductor switches switches more slowly during said transition operation of the solar module than during said normal operation thereof; and
    whereby a dynamic overvoltage on the semiconductor switch is reduced during said transition operation of the solar module so that the voltage present on the semiconductor switch does not exceed said predetermined blocking voltage of said at least one of said semiconductor switches.

2. The solar module of claim 1, in which during normal operation, said converter receives on said input a permissible maximum voltage which is substantially lower than a maximum DC voltage produced the solar cell during said transition operation.

3. The solar module of claim 1, wherein said controller includes a voltage source for driving said at least one of said at least one semiconductor switch, whereby the voltage applied to said switching input may be varied.

4. The solar module of claim 1, wherein said controller includes a variable electrical resistor coupled to said switching input.

5. The solar module of claim 4, wherein said variable electrical resistor is capable of being switched between at least two resistance values.

6. The solar module of claim 5, in which said variable electrical resistor has two terminals and contains at least two partial resistances which can be connected between said two terminals.

7. The solar module of claim 1, further comprising a first monitor module for monitoring overheating of said converter.

8. The solar module of claim 1, having a second monitor module for monitoring an operating period of said transition operation.

9. A method for operating a solar module,
the solar module having a solar cell for generating a DC voltage, and the solar module comprising:
an input for receiving a DC voltage; and
a converter for converting the DC voltage received by the input;
the converter including at least one semiconductor switch having a switching input and a controller for driving the switching input;
the controller further including means for variably driving at least one of the at least one semiconductor switches during a transition operation of the solar module and during a normal operation of the solar module;
the at least one of the at least one semiconductor switches having a predetermined blocking voltage;
the method comprising the step of:
variably driving the controller during the transition operation thereof so that the at least one of the at least one semiconductor switches switches more slowly during the transitional operation of the solar module than during the normal operation thereof;
whereby a dynamic overvoltage on the semiconductor switch is reduced such that the voltage applied to the at least one of the least one semiconductor switches does not exceed the blocking voltage thereof.

10. The method of claim 9, further comprising the step of varying the value of the voltage fed to the switching input.

11. The method of claim 9, further comprising the step of varying a resistance leading to the switching input.

12. The method of claim 11, wherein said step of varying said resistance includes switching between at least two resistance values.

13. Method according to claim 12, wherein said step of switching between at least two resistance values includes connecting at least two partial resistances leading to the switching input.

14. The method of claim 9, further comprising the step of monitoring overheating of the converter.

15. The method of claim 9, further comprising the step of monitoring an operating period of the transition operation.

* * * * *